United States Patent
Gold et al.

(10) Patent No.: US 6,172,550 B1
(45) Date of Patent: *Jan. 9, 2001

(54) CRYOGENICALLY-COOLED SWITCHING CIRCUIT

(75) Inventors: Calman Gold, Londonberry, NH (US); Otward M. Mueller, Shrewsbury, MA (US)

(73) Assignee: American Superconducting Corporation, Westborough, MA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/699,005

(22) Filed: Aug. 16, 1996

(51) Int. Cl.[7] .................................................. H03K 17/92
(52) U.S. Cl. ........................................... 327/366; 327/110
(58) Field of Search .................................... 327/366–373, 327/110; 363/17, 19, 75, 78, 84, 98, 132, 141

(56) References Cited

U.S. PATENT DOCUMENTS 3,770,986 * 11/1973 Drehle ................................... 327/110
4,039,921 * 8/1977 Yoshida et al. ......................... 363/22

(List continued on next page.)

OTHER PUBLICATIONS

Johnson et al., "Cryogenic Power Electronics For Superconductor Energy Application", Aug. 27, 1996.

Brough et al., "Performance of existing SPICE models when applied to power electronic circuits operating at cryogenic temperatures", Aug. 27, 1996.

Iglesias, "Experimental Results of a SMES Fed by a Current Source Inverter", Aug. 25, 1996.

Mueller, "Switching losses of the cryogenic MOSFET and SIT", *Cryogenics*, Dec., 1990, vol. 30, No. 12, pp. 1094–1100.

Mueller, "Cryogenic MOSFET Power Conversion", (Abstract), Proceedings Of The Workshop On Law Temperature Semiconductor Electronics, Aug. 7, 8, 1989, University of Vermont, Burlington, VT, pp. 94–98.

El–Hamamsy, "Design of High–Efficiency RF Class–D Power Amplifier", *IEEE Transactions on Power Electronics*, vol. 9, No. 3, May, 1994, pp. 297–308.

Mohan et al., "Resonant–Switch Converters", *Power Electronics: Converters, Applications, and Design*, pp. 179–203.

Primary Examiner—Jeffrey Zweizig
(74) Attorney, Agent, or Firm—Fish & Richardson P.C.

(57) ABSTRACT

An electronic power conversion circuit includes cryogenically cooled MOSFET power switching devices arranged in a switch-mode configuration and responsive to control signals for reducing capacitive discharge and commutation losses in the circuit by controlling the period between switch-on and switch-off time (i.e., "deadtime") of the MOSFET devices. When one of the MOSFET devices of the circuit is switched off, the opposing MOSFET, after the short deadtime period, is switched on to serve as a commutating device rather, than the opposing MOSFET's intrinsic drain-source diode. The power conversion circuit may include a half-bridge circuit or combinations thereof.

29 Claims, 8 Drawing Sheets

U.S. PATENT DOCUMENTS

| | | | | |
|---|---|---|---|---|
| 4,667,144 | * | 5/1987 | Jones et al. | 327/110 |
| 5,010,304 | * | 4/1991 | Mueller et al. | 330/269 |
| 5,115,386 | * | 5/1992 | Shirahama et al. | 363/41 |
| 5,123,746 | * | 6/1992 | Okada | 363/37 |
| 5,126,830 | * | 6/1992 | Mueller et al. | 357/83 |
| 5,321,235 | * | 6/1994 | Makino et al. | 363/21 |
| 5,347,168 | * | 9/1994 | Russo | 327/366 |
| 5,367,448 | * | 11/1994 | Carroll | 363/89 |
| 5,397,878 | * | 3/1995 | Chen | 327/110 |
| 5,426,388 | * | 6/1995 | Flora et al. | 327/110 |
| 5,450,306 | * | 9/1995 | Garces et al. | 363/41 |
| 5,469,095 | * | 11/1995 | Pappiette et al. | 327/110 |
| 5,550,498 | * | 8/1996 | Kwan et al. | 327/175 |
| 5,612,615 | * | 3/1997 | Gold et al. | 323/360 |
| 5,617,306 | * | 4/1997 | Lai et al. | 363/17 |
| 5,625,548 | * | 4/1997 | Gold et al. | 363/98 |
| 5,642,065 | * | 6/1997 | Choi et al. | 327/110 |
| 5,642,268 | * | 6/1997 | Pratt et al. | 363/17 |
| 5,654,880 | * | 8/1997 | Brkovic et al. | 363/17 |
| 5,654,881 | * | 8/1997 | Albrecht et al. | 363/25 |
| 5,680,301 | * | 10/1997 | Oughton, Jr. et al. | 363/17 |
| 5,748,462 | * | 5/1998 | Moro et al. | 363/97 |

* cited by examiner

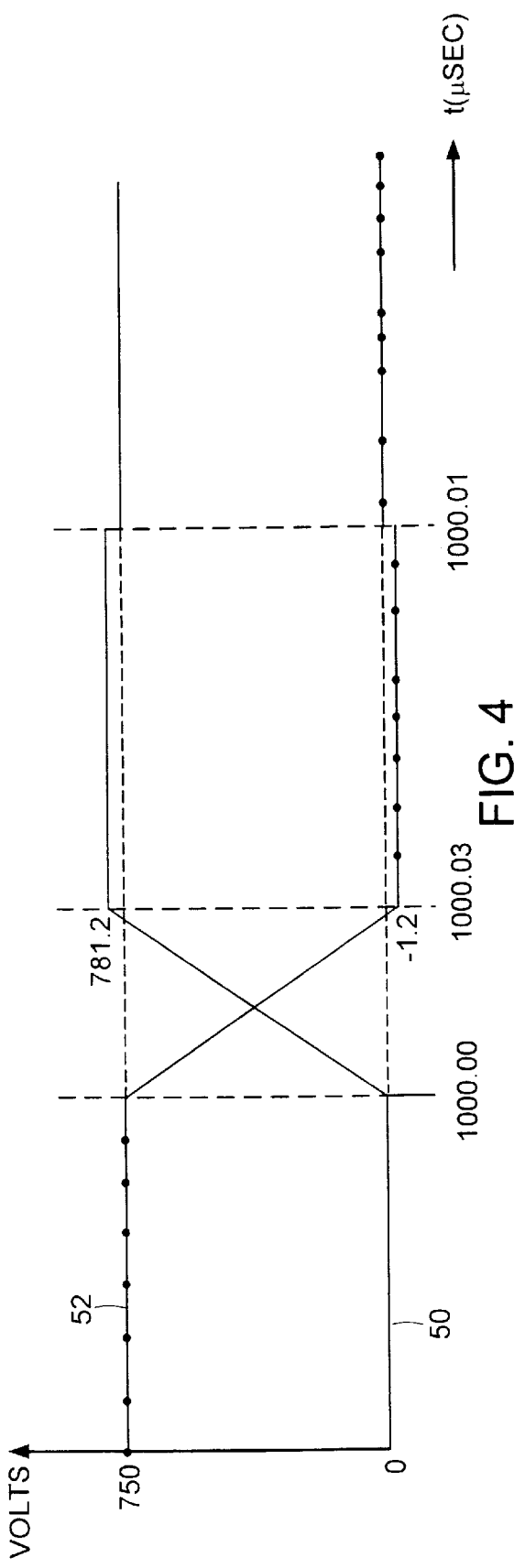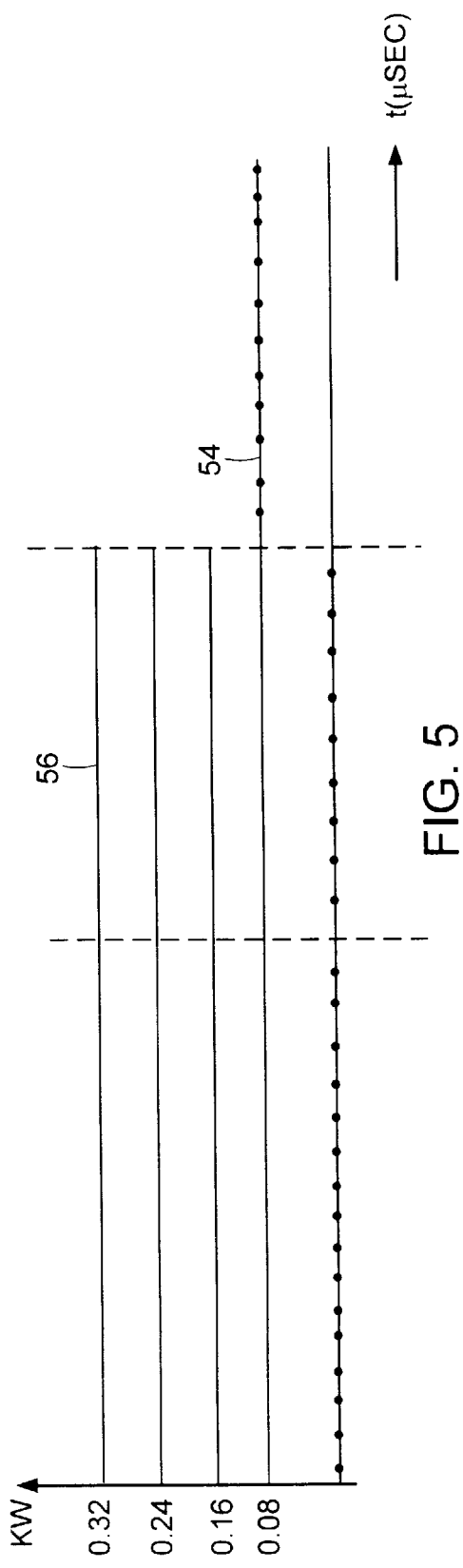

CRYOGENICALLY-COOLED SWITCHING CIRCUIT

BACKGROUND OF THE INVENTION

The invention relates to cryogenically-cooled high voltage, high power electronic switching circuitry.

Efforts in utilizing Metal Oxide Semiconductor Field Effect Transistor (MOSFET) switching devices in cryogenically-cooled high power conversion circuits are ongoing. It has been appreciated that these particular devices, when cryogenically cooled, have unique advantages not found in other conventional high power semiconductor switching devices, including IGBTs, MCTs, GTOs and bipolar transistors (see U.S. Pat. No. 5,126,830, Mueller et al. and U.S. Pat. No. 5,347,168, Russo). For example, power MOSFET's, when operated at a temperature of 77 K, exhibit a reduction of the on-resistance of the MOSFET's typically by a factor of 15 or more, and often by as much as a factor of 30, resulting in a significant decrease of the conduction losses within the devices.

One particularly advantageous use of cryogenically cooled electronics is in high power, switching power supplies. To understand the advantages in more detail, however, a brief discussion of the limitations of such power supplies operating at room temperature needs to be considered. Switch mode amplifiers, regulated power supplies, and frequency converters became a reality with the introduction of high speed power silicon devices. An important advantage of these switch mode applications is that, at least for ideal devices, the only losses involved are the saturation losses of the power devices in the forward direction known as the conduction losses. These conduction losses are very low compared to the losses sustained in linear regulation or amplification devices, thereby resulting in a considerable reduction in the physical size of regulated power supplies and an increase of operating efficiency. There are, however, other losses associated with switch mode converters including the commutation losses associated with the switching device, switching losses, and parasitic discharge losses. The commutation, parasitic discharge, and switching losses are all proportional to the switching frequency. Moreover, capacitive discharge losses may dominate, particularly at high operating voltages, because they are proportional to the square of the applied voltages.

The relationship between switching loss and frequency is important since the typical method used to obtain size reductions in switch mode power supplies is to operate at high switching frequencies which permits replacing conventional power frequency components with significantly smaller filter and active components. These smaller components operate at 300 to 30,000 times the frequency of the older power supplies. At these increased frequencies, the switching losses in the power devices often dominate the overall loss of the power supply.

A switch mode converter may include a commutating diode whose forward voltage drop generates additional losses, referred to as commutating diode losses. The commutating diodes provide a path for the inductive component of load current to flow when the load current is interrupted by turn-off of a switching device. With certain unidirectional high power devices (e.g., IGBTs, GTOs, thyristor diodes) the commutating diodes are added externally.

Soft-Switching techniques which generate so-called Zero-Voltage Switching (ZVS) or Zero Current Switching (ZCS) conditions have been used to reduce the switching losses of switching devices. The switching losses are reduced because the switching of the active device occurs at a point in time when, as the names imply, either the voltage or the current is zero, thus providing a zero power dissipation condition. These techniques are, in general, "waveshaping" circuits having a suitable inductor which resonates or "quasiresonates" with the output capacitances of the active devices in a manner that the ZVS or ZCS conditions are obtained. In the case of capacitive discharge losses, the resonant techniques assure that the capacitances are discharged, not through the active switching device, but through the supply or the load.

However, the resonant circuits used to provide conventional soft-switching generate large over-voltages and over-currents. The switching devices are subjected to these over-voltages and over-currents and, therefore, must be rated to withstand such stresses, a particular problem in high power applications.

SUMMARY OF THE INVENTION

The invention features reducing capacitive discharge and diode commutation losses in switch-mode electronic power conversion circuitry having cryogenically cooled MOSFET power switching devices. The losses are reduced by controlling the period between the switching-on of a MOSFET device and switching-off of another MOSFET device, the pair of MOSFET's connected in a series connected (half-bridge) switch-mode configuration to operate during different portions of a switching cycle. This period between switching one device off and switching the other on, often referred to as "deadtime," is generally required to prevent the possibility of opposing MOSFET devices of the switch-mode circuitry being closed simultaneously. This condition, known as "shoot through," can be fatal to the MOSFET devices, and even if not fatal constitutes an unacceptably large increase in power dissipation in high efficiency conversion circuitry. In accordance with the invention, when one of the MOSFET devices of the circuitry (e.g., a half bridge circuit) is switched off, the opposing MOSFET, after a short deadtime period, is switched-on so that current, normally flowing through the commutating intrinsic drain-to source diode of the opposing MOSFET, flows through the switched-on MOSFET. Thus, the opposing MOSFET serves as the commutating device rather than its intrinsic drain-source diode whose losses are substantially larger at cryogenic temperatures than those of the MOSFET itself.

Moreover, the deadtime period can be selected or dynamically controlled to allow the parasitic capacitances (i.e., drain-source capacitance) associated with the MOSFET devices to be discharged into the load (which generally includes a low pass filter) prior to the MOSFET device being switched on. In high voltage and high power circuitry, this has particular advantage because the MOSFETs are utilized in large parallel arrays exhibiting large values of parasitic capacitance. Thus, the MOSFET is effectively turned on at zero voltage, thereby reducing energy normally discharged through and dissipated by the MOSFET to near zero magnitude. It will furthermore be appreciated that the MOSFET serving as a commutating diode is also turned off at essentially zero voltage.

In one aspect of the invention, a cryogenically cooled switching circuit, having terminals coupled to a load which receives power from the circuit, includes first and second switching devices (arranged in a half-bridge switch mode configuration), each device intrinsically comprising a drain-to-source commutating diode capable of conveying an inductive current component from the load. The first switching device is turned-on during a commutating interval in response to a first control signal following turn-off of the second switching device to convey an inductive current component from the load through the first switching device rather than through the intrinsic drain-to-source commutating diode associated with the first switching device.

In a system utilizing a switch mode configuration as described above, the system may further include a refrigeration unit for cryogenically cooling the switching devices and a controller for both conveying the control signals to the switching devices and establishing the deadtime interval itself.

Particular embodiments of the invention may include one or more of the following features. The switch mode configuration may be a half-bridge circuit or combinations thereof (e.g., a full-bridge circuit). The first and second control signals are pulse width modulated control signals having a duty cycle between 1 percent and 99 percent. The controller may include means for regulating the deadtime interval in response to either the load current or the duty cycle of the PWM signal. The controller may include a circuit for sensing negative current in the switching device. The switch-mode circuit may be configured to provide at least one hundred watts of power to the load. The switching devices are bi-directional, for example, MOSFET devices, including BiMOSFETs and similar devices.

The circuit may be a polyphase switching circuit including a plurality of switching devices and the power source applied to the input terminals of the polyphase switching circuit include a plurality of alternating current input signals having a differential phase shift relationship with respect to each other. The differential phase shift between the plurality of alternating current input signals applied to the polyphase switching circuit is 120°. It will be appreciated, that the power conversion circuits incorporating the invention consist in one or more halfbridge switch mode configurations and that such configurations consist in bidirectional devices. Thus, it will be appreciated that the circuit topologies are inherently bidirectional, and that the benefits of the invention accrue when the load and source are interchanged. For example, an inverter may be utilized reversibly as a rectifier. In another example, a step-up DC-DC converter may be used reversibly as a step-down DC-DC converter. The switching circuit may be an AC chopper. The circuit may be a sinusoidally PWM inverter.

Other features and advantages of the invention will be apparent from the following description taken together with the drawings in which:

BRIEF DESCRIPTION OF THE DRAWING

FIG. 4 is a representation of the voltage across the upper and lower half bridge switches of the circuit of FIG. 3 during a switch transition.

FIG. 5 is a representation of the power dissipation in both the intrinsic diode and the enhanced MOSFET for the lower half bridge switch of the circuit of FIG. 3.

DESCRIPTION OF THE PREFERRED EMBODIMENTS

Figure 1:
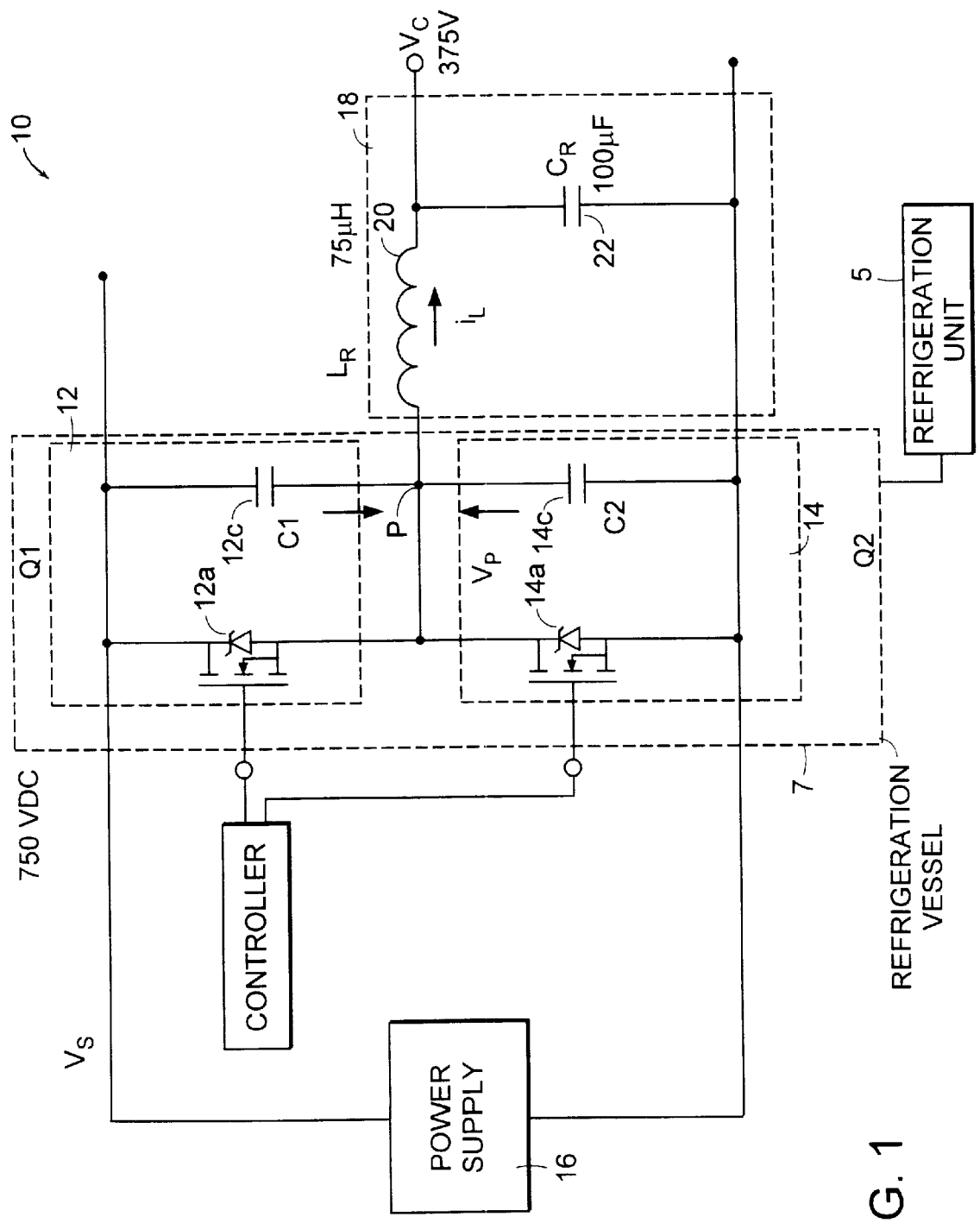
FIG. 1 is a circuit diagram of a cryogenically-cooled half-bridge switch mode power supply circuit.

Referring to FIG. 1, a cryogenically-cooled halfbridge power conversion circuit includes a pair of series connected MOSFET switches 12, 14, driven by a DC power supply 16. Half bridge circuit delivers a desired output waveform to a low pass filter 18 connected across a common poling point P. Low pass filter 18 includes an inductor in series with a capacitor 22 connected to ground. The half bridge circuit is operational, for example, as a single phase rectifier or inverter and, in response to switch control signals, can generate either positive or negative load current flow. Each MOSFET switch 12, 14 is, for example, a commercially available high voltage (1000V) n-channel MOSFET having a current rating of 23A. MOSFET switches 12, 14 and low pass filter are both cooled to a temperature of less than 230 K, and preferably about 150 K, using a cryogenic refrigeration unit 5. (In those situations when the cost benefits can justify the expense, the circuitry can be cooled even more, for example to 77 K). In actual implementation, the electronic assembly is contained within a thermally insulated cryostat 7 and the contents are cooled by any one of several known methods for electronic cooling including but not limited to conduction and convection cooling.

Figure 1A:
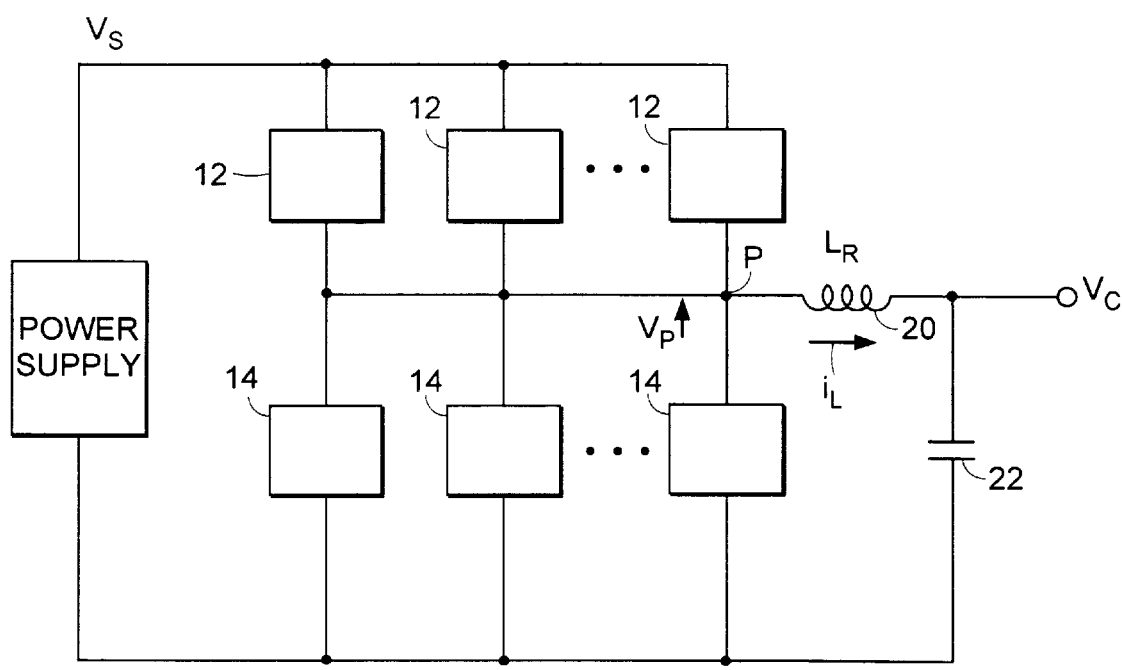
FIG. 1A is a circuit diagram of a cryogenically cooled half-bridge switch mode power supply circuit employing several MOSFET's in parallel.

Each MOSFET device 12, 14 includes a built-in drain-source diode 12a, 14a formed intrinsically during the fabrication of the MOSFET device In the cooled condition, the MOSFET device with intrinsic drain source diode behaves like a FREDFET™ (fast recovery epitaxial diode FET) and can provide an important advantage in the circuit. Diodes serving this purpose are generally required to be added externally for other types of devices (for example, IGBTs, GTOs, thyristor diodes) used in high power circuits; and accordingly the circuit of the invention has fewer circuit components than such prior traditional implementations at a 400 K operating environment. It is important to note that, in general, intrinsic diodes 12a, 14a of the MOSFETs play no direct role in the operation of the MOSFET and are not desired to be utilized because of their slow switching speed and large recovery charge, particularly in a 360 K operating device. However, the speed of switching associated with the intrinsic diodes is substantially increased at cryogenic temperatures due to the increase in its carrier mobility, a decrease in minority carrier lifetime, a reduction in recovery charge, and a reduction in the reverse recovery time of the intrinsic drain source diode at lower cryogenic temperatures. Operating the MOSFET at cryogenic temperatures helps to insure that, in normal operation, intrinsic diodes 12a, 14a do not conduct. This is because the forward voltage of the intrinsic drain source diode at cryogenic temperatures is greater than the forward voltage exhibited at 25° C., and because the voltage drop of the cooled MOSFET at a specified current is lower than that of the intrinsic diode. As a result, in cryogenic operation, current flows preferentially in the MOSFET channel, not through the intrinsic diode. This condition can be guaranteed in high power circuit design by paralleling several MOSFET devices per switching device to further reduce the voltage drop of the MOS- FET switch relative to that of the intrinsic diode, as illustrated in FIG. 1A.

Figure 2:
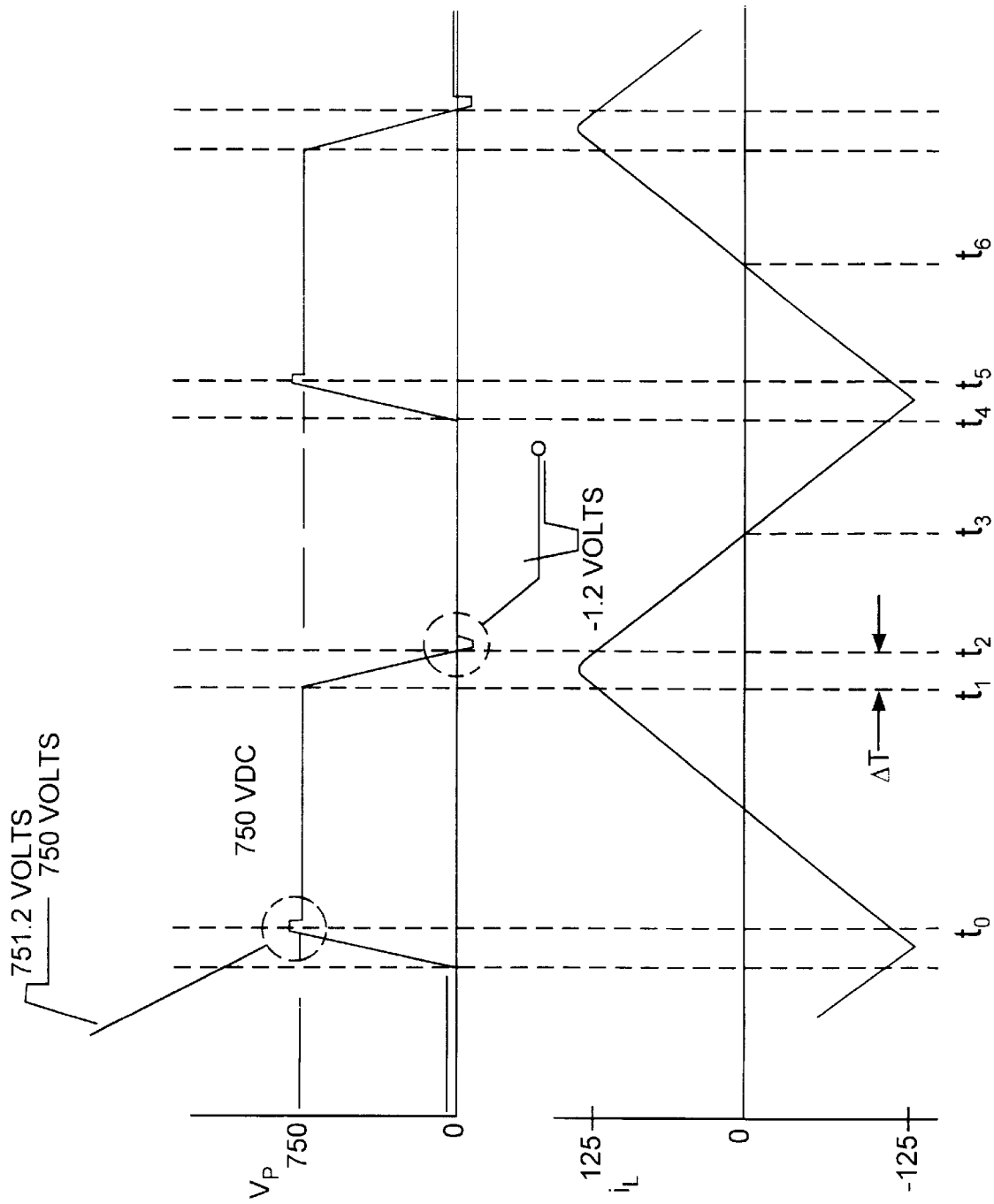
FIG. 2 shows the switch voltages and inductor current waveforms for the circuit of FIG. 1 under 50% duty cycle conditions and no DC load current.

FIG. 2 represents the midpoint voltage $V_P$ at point P and the inductor current $i_L$, respectively, for the half-bridge circuit 10 of FIG. 1 with the MOSFET devices 12, 14 controlled by a 10 KHz, 50% duty cycle PWM control signal. In this particular application, each half-cycle is 50 $\mu s$ long. It should be noted that the circuit exemplified by FIG. 1 and the representations of FIG. 2 is that of a circuit delivering zero DC load current as there is no dissipative load being supplied. While this will serve as an illustrative example of the principles of operation of the invention, the behavior of circuitry wherein real load power is delivered and in which the duty cycle is other than 50% depart in some aspects from this example. The behavior of circuits more typical of most DC/DC converters and of polyphase inverters will be discussed later in further description of the invention.

Neglecting any start-up dynamics for simplicity, device 12 is turned on at time $t_o$. Between $t_o$ and $t_1$, capacitor 22 can be considered an AC short-circuit or a 375 volt voltage source with the current through the filter inductor increasing according to the following relationship $V_S = L_R (di/dt)$.

At time $t_1$, device 12 is turned off rapidly (e.g., in less than 15 ns). (The MOSFET current fall time and rise time both decrease as the temperature of the MOSFET decreases.) When device 12 turns off at $t_1$, the current through inductor 20 cannot change instantaneously but continues to flow. This inductor current $i_L$ discharges parasitic capacitor 14c and charges parasitic capacitor 12c because there is no other current path possible. Since both devices 12, 14 and intrinsic diodes 12a, 14a are in their off condition no current can flow through them. Thus no power dissipation occurs in devices 12, 14. During the deadtime period between $t_1$ and $t_2$, the voltage across device 12 is small therefore the turn-off loss is also small. The faster the turnoff time, the lower the loss.

It is important to note that the inductive load current actually helps in the charging and discharging of capacitors 12c, 14c. If, for example, device 12 is conducting, capacitor 12c is discharged and capacitor 14c is fully charged with the maximum supply voltage.

Assuming that capacitors 12c, 14c are equal, Q=C* (maximum supply voltage) and the discharge current is equal to one half of the coil current $i_L$. The charge Q is now discharged during the time interval $\Delta T = (t_2 - t_1) = Q/(i_L/2) = 2Q/i_L$. Note that $\Delta T$ is inversely proportional to the peak current. During the $\Delta T$ deadtime, a lossless change in the pole voltage $V_P$ occurs from ~750 V (the supply voltage) down to ~0 V assuming lossless capacitors; thus, dissipation in the MOSFET has been significantly minimized. The coil current is still about the same ($i_L = 125$ A).

When MOSFET device 14 is not conducting, diode 14a can serve as a commutating diode at which time it is automatically forward biased and carries the coil current for the time interval between $t_2$ and $t_3$. Most circuits employing uni-directional minority carrier devices (IGBTs, MCTs, Bipolars, GTO's etc.) generally include an external diode for this very purpose. As discussed above, however, all of the problems related to adding an external commutating diode to such unidirectional minority carrier devices must be considered. But, because MOSFET devices are bi-directional, drain current can flow in both directions. Thus, in accordance with the invention, at time $t_2$, MOSFET device 14 can be turned-on, automatically or by a controller, to serve as a commutating diode. In this way, the inductive load current is allowed to flow through MOSFET device 14 under a zero-voltage switching condition there by minimizing commutation losses. It is important to note that it is only by cryogenically cooling the MOSFET devices that this is possible at high voltages and high power levels. Under room temperature operating conditions, the voltage drop across the high on-resistance of a high-voltage MOSFET would normally forward bias the intrinsic source-drain diode above a specific current. Cryocooling a 0.53 ohm MOSFET device to, for example, 77 K, increases the on-state voltage of the intrinsic diode to about 1.2 V while the on-state voltage of the MOSFET device at ten amperes decreases to about 0.3 V. Thus, the intrinsic drain source diode is not forward biased and the conduction loss, during the commutating time, is reduced by a factor of 4 (1.2/0.3). If ten such MOSFETs were to be paralleled in a switch (as illustrated diagrammatically in FIG. 1A), the forward drop at ten amperes would be 0.03 volts and conduction losses during the commutating time would be reduced by a factor of 40. When MOSFET device 14 is turned-on at time $t_2$, the current $i_L$ flows from its source to its drain until time $t_3$ where it changes its direction. Capacitor 22 acts now as a high voltage source and a negative inductance current flows. At time $t_4$, MOSFET device 14 is turned off, again under an almost zero-voltage condition. Capacitor 12c is now discharged and capacitor 14c is charged as described above. At time $t_5$ MOSFET device 12 is turned on again. Thus, the only requirement for implementing this approach is to apply the appropriate deadtime $\Delta T$ prior to the switching action.

In the circuit of FIG. 1 wherein a net DC current is delivered to a dissipative load and at any duty cycle, as would be common in many DC-DC converters and in polyphase inverters, the current in the inductor changes in magnitude but not in direction during each switching cycle. The operation of the circuit of FIG. 1 in this instance is altered in that the discharge of parasitic capacitances during the deadtime interval is not equal for both switches in the circuit. For example, examine the case in which the upper switch 12 is on for 80 percent of the time and the lower switch 14 is on and acts as a commutating diode for the remaining roughly 20 percent of the switching period. In this case, the current flow is outward directed to the load and does not reverse direction. As a result, the capacitance 14c is discharged and the capacitance 12c is charged during the deadtime transition following the turnoff of switch 12 as previously described. Switch 14 functions as a commutating diode during the commutating interval and yields the benefits of reduced conduction loss according to the invention. The major difference is the behavior of the circuit during the deadtime following the turn off of switch 14. Because the current has not reversed direction, the capacitance 14c remains discharged and the capacitance 12c remains charged following zero voltage turnoff of switch 14. This results in a full voltage turn on of switch 12 with corresponding capacitive discharge loss.

As another example in which the circuit of FIG. 1 yields the benefit of reduced commutation loss but does not necessarily result in zero voltage switching, consider the behavior of the circuit at very light load, i.e. low output current. Depending upon both the magnitude of inductance and the magnitude of the parasitic capacitances 14c and 12c, it is possible to observe a reduced, yet non-zero, voltage switching condition. This is because the linear voltage transition shown for switches 12 and 14 is a portion of a resonant voltage transition which, due to the action of the intrinsic diodes of switches 12 and 14, is clamped to the DC power supply rails. However the resonant behavior persists, and if the deadtime interval is long enough, the voltages on capacitors 12c and 14c will ring back up to a non-zero value prior to the turn on of one or the other switch. It will be appreciated that at such light load currents, the conduction and commutation losses will in general be very low, thus a capacitive discharge loss sustained in this instance is not detrimental to the circuit performance. It will likewise be appreciated that because capacitive discharge losses are proportional to the square of the capacitor voltage, a reduction of capacitor voltage of only 50 percent will still yield a 75 percent reduction of this loss component.

Figure 3:
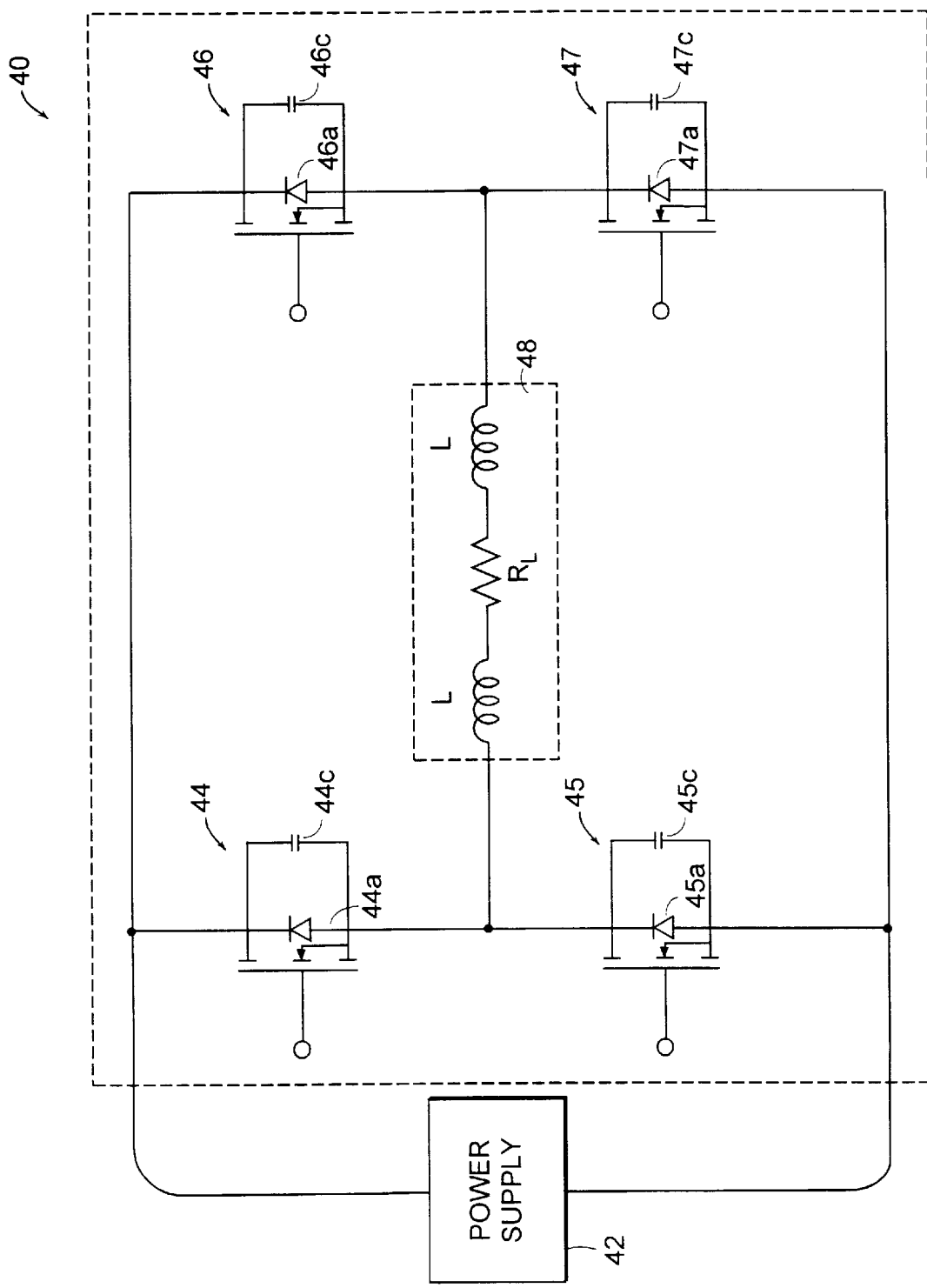
FIG. 3 is a circuit diagram of a cryogenically cooled four quadrant chopper.

Referring to FIG. 3, a pair of the above described half bridge circuits can be combined to provide a cryogenically-cooled four quadrant chopper 40 which can serve as the basis for a single-phase full-bridge rectifier/inverter circuit. Chopper 40, driven by a DC power supply 42, includes four MOSFET switching devices 44–47 which together deliver a desired output waveform to an inductive load 48. Each switching device 44–47 includes an associated drain source intrinsic diode 44a–47a and a parasitic capacitance 44c–47c.

Referring to FIG. 4, voltage waveforms 50 (solid) and waveform 52 (dotted) represent the voltage across upper 44 and lower 45 half bridge switches, respectively, assuming a supply voltage of 750 V from supply 42, and that switching devices 44 and 47 are turned-on with switching devices 45 and 46 being off. Note that the load resistor in 48 is 2.5 ohms and in the steady state prior to the switch transition there is a load current of 300 Amperes flowing in switching devices 44 and 47. At time t=1000 microseconds, switching devices 44 and 47 are switched off and at t=1000.1 microseconds switching devices 45 and 46 are switched on to establish a 100 nanosecond deadtime interval. Note that at the time switching devices 44 and 47 are switched off, the voltage across these devices linearly decreases. Simultaneously, the voltage across switching devices 45, 46 linearly increases.

Referring now to FIG. 5, waveform 54 indicates the power dissipation in kilowatts of the MOSFET switching 45 (dotted line) and waveform 56 indicates the power dissipation in kilowatts of the intrinsic drain source diode 45a (solid line) associated with switching device 45. Note that shortly after switching devices 44 and 47 are switched off 30 nanoseconds later (t=1000.03 microseconds), intrinsic diode 45a turns on and carries the lower current flowing between the pair of opposing devices 45 and 46. It is during this 30 nanoseconds of deadtime that capacitors 45c and 46c charge and discharge, respectively. However, as soon as switching MOSFET device 45 is turned on, its lower on-state voltage causes current to flow through the MOSFET device rather than through its intrinsic diode and power dissipation drops to about one fourth that of the diode. Thus, the sooner the MOSFET device is switched on, the less time the intrinsic diode is allowed to conduct, thereby significantly reducing power dissipation during the commutation interval. In general, because some deadtime is required between the switching off of one of the opposing pair of cryogenically cooled MOSFET switching devices and the switching on of the other of the opposing pair, the intrinsic diode must conduct for some time. However, because the parasitic capacitances charge and discharge relatively quickly, this period can be made to be far less than that normally used with conventional soft-switching approaches.

Figure 6:
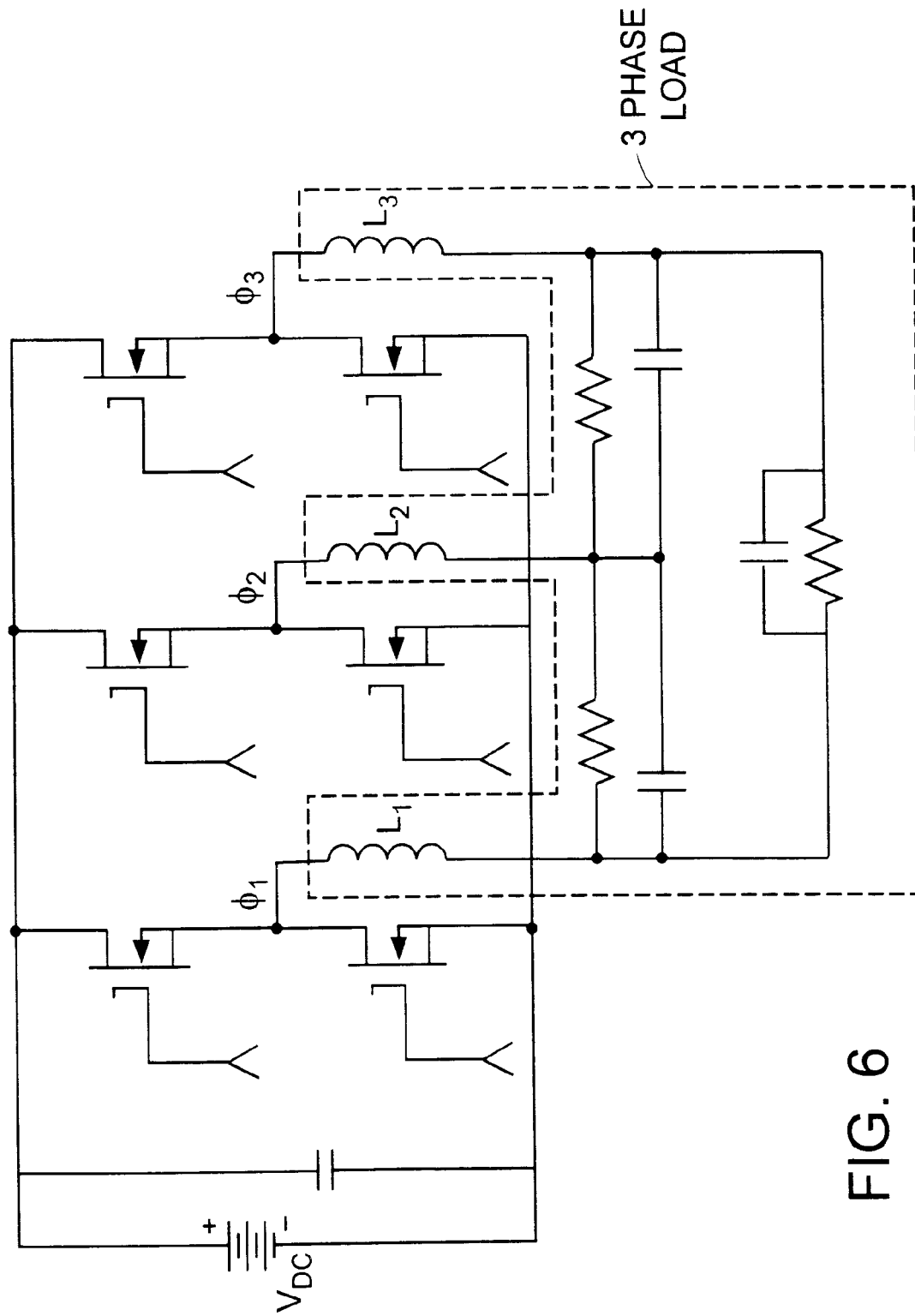
FIG. 6 is a schematic diagram of a polyphase cryogenic switch mode power supply circuit.

FIG. 6 illustrates the switch topology of a three phase cryogenically operable inverter/converter. It should be noted that the inverter/converter topology consists in three half-bridge structures. In the polyphase implementation of the method, as would be applicable for example in a three phase sinusoidal pulse width modulated inverter, the three half-bridges operate essentially in an independent manner but in such a way that the filtered phase outputs applied to the load are sinusoids at the desired amplitude and frequency and exhibit a relative phase shift of 120 degrees with respect to one another. The PWM duty cycle of each half-bridge in the inverter differs from that of the other two at all but a few special instants. Furthermore, the switch transition instants in one halfbridge are not necessarily synchronous with those of another half-bridge even if the PWM carrier ramp is identical for all half-bridges. From the standpoint of switching and capacitive discharge loss reduction, the three half-bridges in the inverter are essentially independent of one another in each switching cycle. The required dead-time for each half-bridge is a function of the magnitude of the pole current at the instant of switch turnoff, and can be adjusted to insure a reduction of both capacitive discharge losses and commutating losses required in a specific inverter design. In the case wherein the method of the invention is applied in such a way as to adaptively control the deadtime interval, each half-bridge should be controlled independently of the others with respect to the application of dead-time generation.

Figure 7:
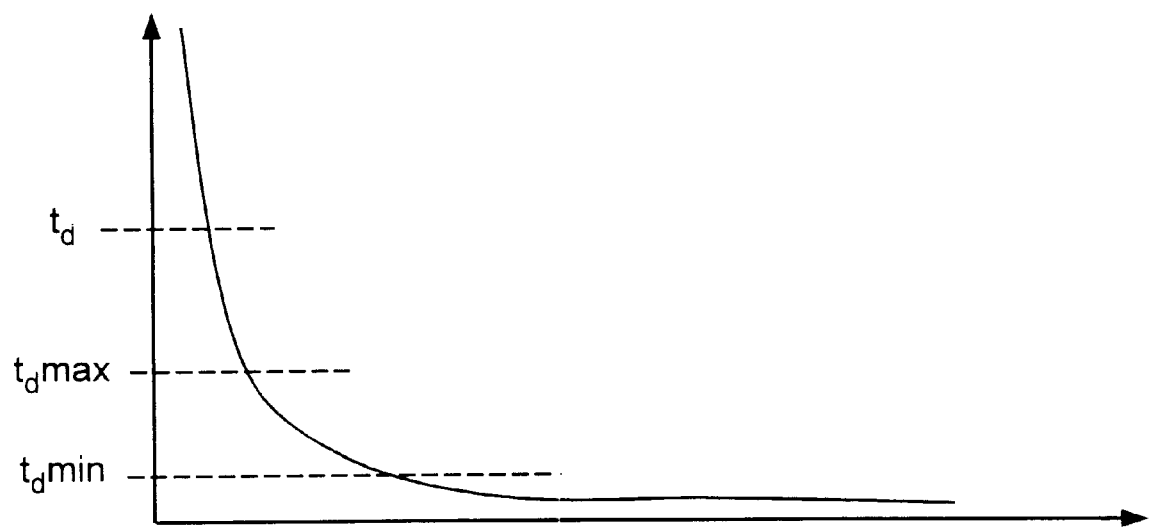
FIG. 7 is a diagram indicating the relationship of the deadtime to the magnitude of the load current and limits imposed by practical design considerations.

In selecting the deadtime interval for a specific power conversion topology, set of operating conditions (for example, voltage, current, frequency, . . . ), and semiconductor device, there exist several practical considerations which govern the upper and lower bounds of acceptable deadtime magnitude. FIG. 7 shows the general quantitative relationship between deadtime interval and the magnitude of the pole (i.e midpoint) current of the half-bridge at the onset of the deadtime interval. From the previous discussion relating to FIG. 2A and the linear voltage discharge of parasitic capacitances of a switching device, it will be recalled that for a specified capacitance and initial charged voltage, the time necessary to discharge the capacitor is inversely proportional to the discharge current, which is equal to one half the pole current of the half-bridge. Recall that during the very short transition deadtime, the discharge current is approximately a constant. It will be appreciated that large values of load current generally result in the largest commutation losses and yet require the shortest parasitic discharge times, as can be seen from the hyperbolic characteristic of the curve of FIG. 7. From the standpoint of a minimum acceptable deadtime to be applied, the lower bound is the maximum guaranteed turn off time of a switching device including all associated propagation and turnoff delays associated with the gate drive circuit from the time of application of a turnoff command from the controller. The specific value is a strong function of the power level of the circuitry and the speed with which the switching devices are driven to an on state or an off state. There is no single generally applicable value of minimum deadtime.

The maximum acceptable deadtime is an engineering design choice involving several tradeoffs. For example, while it is evident from the curve of FIG. 7 that one can lengthen deadtime at low magnitudes of pole current in an effort to achieve true zero voltage switching in the commutating device, this may not be practical in terms of the incremental loss reduction gained. One compelling reason to severely limit the maximum deadtime permissible is that large values of deadtime reduce the minimum pulse width that can be achieved in a pulse width modulation converter. Where low waveform distortion and fine control of output voltage is required, one would not want to restrict duty cycles to less than, for example 20% or more than 80%. Excessive deadtimes reduce the dynamic range of available duty cycle. It should be apparent from prior discussion that at low current levels commutation losses are quite low. Thus sacrificing dynamic range for excessive deadtime will most likely not result in appreciable gains in capacitive discharge loss reduction. Recall also that a 50 percent reduction in capacitor voltage yields a 75 percent reduction in capacitive discharge loss. Thus, true zero voltage switching is not a requirement for low loss, especially at low current. A fixed value of deadtime commensurate with desired circuit performance requirements at high current and of acceptable minimum value is generally acceptable.

Figure 8:
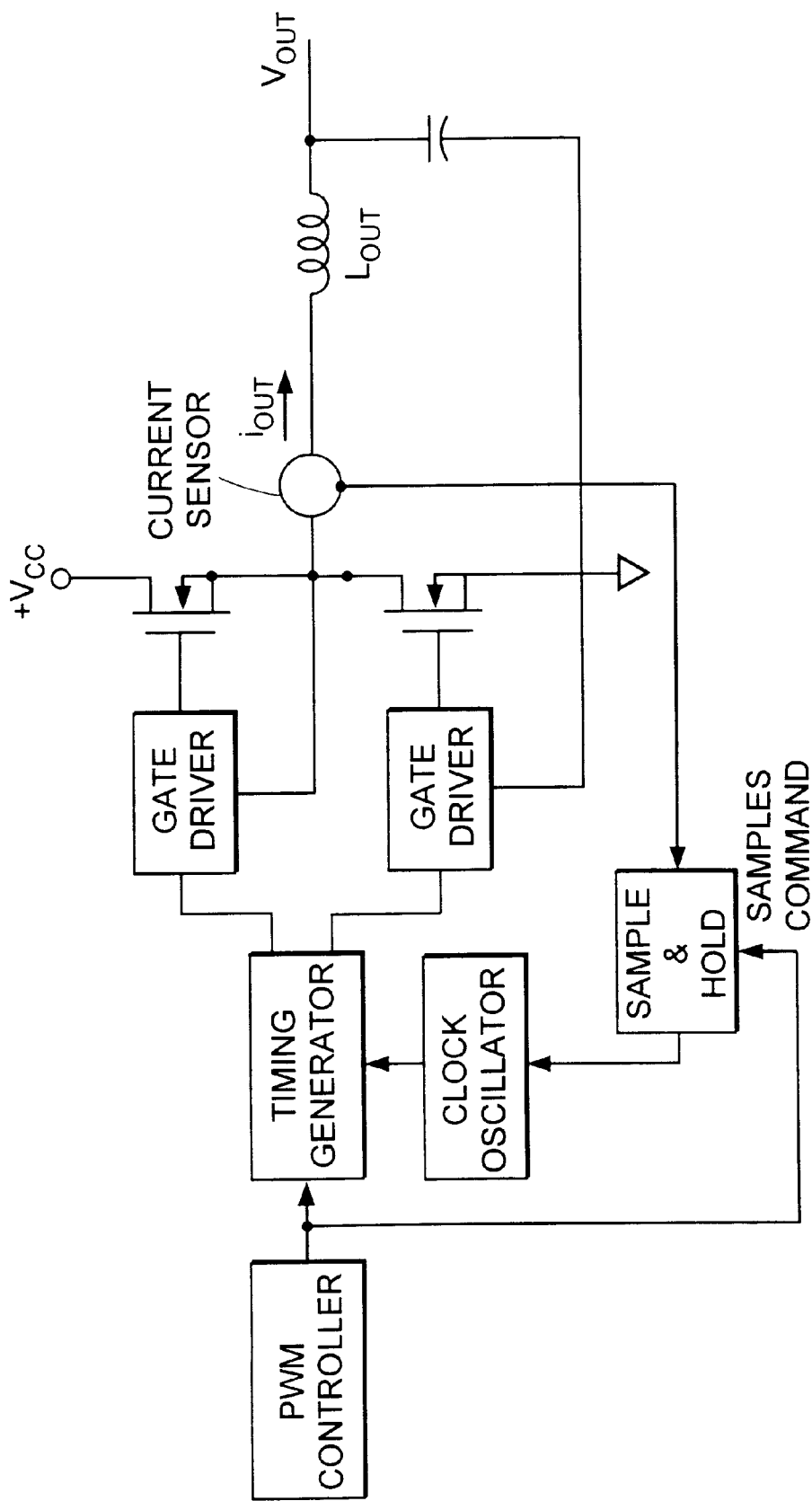
FIG. 8 is a diagram of the switchmode controller and its connection to a half-bridge circuit.

There may be specific circuit considerations wherein feedback control and regulation of the deadtime interval in response to the pole current is required and does provide an advantage. In such an instance, the deadtime interval can be modified on a pulse by pulse basis to yield an optimal value for loss reduction. This is generically illustrated in FIG. 8. This can be achieved in the most general and preferred embodiment by sampling the output current at the switching transition instant just prior to turning off a switching device and using the stored sample of the sensed signal to electronically modify the timing elements of the deadtime delay generating circuitry. If the timing delay is controlled by the frequency of an oscillator, then one may voltage control the oscillator frequency using the feedback signal from the output current sensing circuit. For example, as shown in FIG. 8, a deadtime controller 100 includes a pulse width modulation (PWM) controller 102 connected to a timing generator 104. Timing generator 104 provides control signal to each of MOSFET switches 12, 14 via gate drivers 106, 108. respectively. Timing generator 104 also receives an input signal from an output current sensing circuit, which includes a current sensor 110, sample and hold circuit 112, and clock oscillator 114. Sample and hold circuit 112 receives a sensed current signal from sensor 110 and a sample command signal from PWM controller 102. If the timing network is a passive network, e.g. an RC network, one can achieve timing variation by voltage control of capacitance or resistance. Those conversant in the art will readily recognize other ways for affecting the modification of timing delays by voltage or current control.

What is claimed is:

1. A power conversion system comprising:
   a switching circuit having an input terminal for supplying power to said circuit and an output terminal coupled to a load which receives power from said circuit, said circuit comprising:
   cryogenically cooled first and second switching devices, each switching device comprising an intrinsic drain-to-source commutating diode capable of conveying an inductive current component from the load;
   a controller, which controls a deadtime period between switching of the first switching device and the second switching device, the controller providing a first control signal to turn-on the first switching device in a first time interval following turn-off of the second switching device, such that an inductive current component flows through the first switching device rather than through the intrinsic drain-to-source diode associated with the first switching device, said controller including a sensing circuit for sensing said inductive current component for generating said first control signal; and
   a refrigeration unit for cryogenically cooling at least said switching devices.

2. The power conversion system of claim 1 further comprising an inductor filter connected to the output terminal, and wherein said refrigeration unit cryogenically cools said inductor filter.

3. The power conversion system of claim 1 wherein said switching devices are MOSFETs.

4. The power conversion of claim 1 wherein the controller includes:
   sample-and-hold circuitry which samples the inductive current component with the sensing circuit; and
   a clock oscillator, responsive to a control signal from the sample-and-hold circuitry, for generating a feedback signal;
   a timing generator which, in response to a pulsewidth modulated signal and the feedback signal, generates the first control signal and a second control signal.

5. A method of reducing the switching losses of a cryogenically-cooled switching circuit comprising first and second switching devices connected to a load circuit having an inductive component, each of said switching devices comprising an intrinsic drain-to-source commutating diode, said method comprising the steps of:
   controlling a deadtime period between switching of the first switching device and the second switching device by:
      applying to the first switching device when in a turned-on state, a first control signal to turn-off said first switching device;
      applying, in the deadtime period following turn-off of said first switching device, a second control signal to turn-on said second switching device to convey an inductive current component from the load circuit through said second switching device rather than through said intrinsic drain-to-source commutating diode associated with said second switching device; and
      generating said second control signal in response to a sensed value of the inductive current component.

6. The method of claim 5 wherein said step of applying a second control signal occurs at a time when a voltage across the second switching device is substantially zero.

7. The method of claim 5 further comprising the step of discharging a parasitic capacitance of said second switching device during the commutation interval.

8. A switching circuit having an input terminal for supplying power to said circuit and an output terminal coupled to a load receiving power from said circuit, comprising:
   a pair of switching devices including a cryogenically cooled first switching device and a cryogenically cooled second switching device, each switching device comprising an intrinsic drain-to-source commutating diode capable of conveying an inductive current component from the load; and
   a controller, which controls a deadtime period between switching of the first switching device and the second switching device, the controller providing a first control signal to turn-on the first switching device in a first deadtime period following turn-off of the second switching device, such that an inductive current component flows through the first switching device rather than through the intrinsic drain-to-source diode associated with the first switching device, said controller including a sensing circuit for sensing said inductive current component for generating said first control signal, the controller including
   sample-and-hold circuitry which samples the inductive current component with the sensing circuit;
   a clock oscillator, responsive to a control signal from the sample-and-hold circuitry, for generating a feedback signal; and
   a timing generator which, in response to a pulsewidth modulated signal and the feedback signal, generates the first control signal and a second control signal.

9. A half-bridge switching circuit having an input terminal for supplying power to said circuit and an output terminal coupled to a load receiving power from said circuit, comprising:

a pair of switching devices including a cryogenically cooled first switching device and a cryogenically cooled second switching device, the pair of switching devices being configured as a half-bridge circuit, each switching device comprising an intrinsic drain-to-source commutating diode capable of conveying an inductive current component from the load; and a controller, which controls a deadtime period between switching of the first switching device and the second switching device, the controller providing a first control signal to turn-on the first switching device in a first deadtime period following turn-off of the second switching device, such that an inductive current component flows through the first switching device rather than through the intrinsic drain-to-source diode associated with the first switching device, said controller including a sensing circuit for sensing said inductive current component for generating said first control signal.

10. The half-bridge switching circuit of claim 9 wherein turn-on of said first switching device during the first deadtime period occurs at a time when a voltage across the first switching device is substantially zero.

11. The half-bridge switching circuit of claim 9 wherein the first and second control signals are pulse width modulated control signals having a duty cycle in the range of 10% to 90%.

12. The half-bridge switching circuit of claim 9 wherein the first and second control signals are pulse width modulated control signals having a duty cycle in the range of about 30% to about 70%.

13. The half-bridge switching circuit of claim 9 wherein the pair of switching devices provide at least one hundred watts of power to the load.

14. The half-bridge switching circuit of claim 9 wherein said switching devices are bi-dirctional devices.

15. The half-bridge switching circuit of claim 14 wherein said bi-directional devices are MOSFET devices.

16. A full-bridge switching circuit having an input terminal for supplying power to said circuit and an output terminal coupled to a load receiving power from said circuit, comprising:

a first pair of switching devices including a cryogenically cooled first switching device and a cryogenically cooled second switching device, the first pair of switching devices being configured as a half-bridge circuit, each switching device including an intrinsic drain-to-source commutating diode capable of conveying an inductive current component from the load;

a second pair of switching devices including a cryogenically cooled third switching device and a cryogenically cooled fourth switching device, the second pair of switching devices being configured as a half-bridge circuit, each switching device including an intrinsic drain-to-source commutating diode capable of conveying the inductive current component from the load, the first, second, third and fourth switching devices being configured as a full-bridge circuit; and a controller controlling a deadtime period between switching of the first, second, third and fourth switching devices, the controller providing a first control signal to turn-on the first switching device and the third switching device in a first deadtime period following turn-off of the second switching device and the fourth switching device, such that an inductive current component flows through the first switching device and the third switching device rather than through the intrinsic drain-to-source diode associated with the first switching device and the third switching device.

17. The full-bridge switching circuit of claim 16 wherein turn-on of said first switching device and said third switching device in the first deadtime period occurs at a time when voltages across the first switching device and the third switching device are substantially zero.

18. The full-bridge switching circuit of claim 16 wherein the first and second control signals are pulse width modulated control signals having a duty cycle in the range of 10% to 90%.

19. The full-bridge switching circuit of claim 16 wherein the first and second control signals are pulse width modulated control signals having a duty cycle in the range of about 30% to about 70%.

20. The full-bridge switching circuit of claim 16 wherein the two pairs of switching devices provide at least one hundred watts of power to the load.

21. The full-bridge switching circuit of claim 16 wherein said switching devices are bi-dirctional devices.

22. The full-bridge switching circuit of claim 21 wherein said bidirectional devices are MOSFET devices.

23. A polyphase switching circuit having an input terminal for supplying power to said circuit and an output terminal coupled to a load receiving power from said circuit, comprising:

a plurality of pairs of switching devices configured as a polyphase switching circuit having an input terminal, each of the pair of switching devices having an intrinsic drain-to-source commutating diode capable of conveying the inductive current component from the load, said polyphase switching circuit having a set of terminals for receiving a plurality of alternating current signals having a differential phase shift relationship with respect to each other, a controller controlling a deadtime period between switching of the switching devices, the controller providing a first control signal to turn-on a first one of the pair of switching devices in a first deadtime period following turn-off of a second one of the pair of switching devices, such that an inductive current component flows through the first one of the pair of switching devices rather than through the intrinsic drain-to-source diode associated with the first one of the switching devices.

24. The polyphase switching circuit of claim 23 wherein turn-on of said first switching device in the first deadtime period occurs at a time when a voltage across the first switching device is substantially zero.

25. The polyphase switching circuit of claim 23 wherein the first and second control signals are pulse width modulated control signals having a duty cycle in the range of 10% to 90%.

26. The polyphase switching circuit of claim 23 wherein the first and second control signals are pulse width modulated control signals having a duty cycle in the range of about 30% to about 70%.

27. The polyphase switching circuit of claim 23 wherein the plurality of pairs of switching devices provide at least one hundred watts of power to the load.

28. The polyphase switching circuit of claim 23 wherein said switching devices are bi-dirctional devices.

29. The polyphase switching circuit of claim 28 wherein said bi-directional devices are MOSFET devices.

* * * * *